United States Patent
Robbins

(10) Patent No.: US 8,618,864 B2
(45) Date of Patent: Dec. 31, 2013

(54) SELF-POWERED ACTIVE RECTIFIER CIRCUIT AND RELATED METHOD OF OPERATION FOR PHOTOVOLTAIC SOLAR POWER ARRAYS

(75) Inventor: Steven Andrew Robbins, Calabasas, CA (US)

(73) Assignee: Steven Andrew Robbins, Calabasas, CA (US)

( * ) Notice: Subject to any disclaimer, the term of this patent is extended or adjusted under 35 U.S.C. 154(b) by 380 days.

(21) Appl. No.: 13/159,952

(22) Filed: Jun. 14, 2011

(65) Prior Publication Data

US 2011/0242865 A1    Oct. 6, 2011

Related U.S. Application Data

(60) Provisional application No. 61/476,391, filed on Apr. 18, 2011.

(51) Int. Cl.
*H03K 17/687* (2006.01)

(52) U.S. Cl.
USPC .......................... 327/427; 327/428; 363/127

(58) Field of Classification Search
USPC .......... 327/419, 427, 428, 530, 540; 363/125, 363/126, 127

See application file for complete search history.

(56) References Cited

U.S. PATENT DOCUMENTS

| | | | |
|---|---|---|---|
| 4,322,724 A | 3/1982 | Grudzinski | |
| 4,417,164 A | 11/1983 | Edlund | |
| 6,747,880 B2 | 6/2004 | Grover | |
| 7,208,928 B2* | 4/2007 | Nebrigic et al. | 323/285 |
| 2002/0141214 A1* | 10/2002 | Grover | 363/125 |
| 2005/0218964 A1 | 10/2005 | Oswald et al. | |
| 2010/0208498 A1 | 8/2010 | Rubio et al. | |
| 2011/0006232 A1 | 1/2011 | Fahrenbruch et al. | |

* cited by examiner

*Primary Examiner* — Long Nguyen

(57) ABSTRACT

The active rectifier circuit and related method of operation disclosed herein is self-powered and improves the efficiency and reliability of photovoltaic solar power systems by replacing the conventional bypass and blocking rectifiers used in such systems. The circuit includes a power MOSFET used as a switch between the anode and cathode terminals, and control circuitry that turns on the MOSFET when the anode voltage is greater than the cathode voltage. The method of operation utilizes resonance to produce a large periodic voltage waveform from the small anode-to-cathode dc voltage drop, and then converts the period voltage waveform to a dc voltage to drive the gate of the power MOSFET.

11 Claims, 8 Drawing Sheets

SELF-POWERED ACTIVE RECTIFIER CIRCUIT AND RELATED METHOD OF OPERATION FOR PHOTOVOLTAIC SOLAR POWER ARRAYS

CROSS-REFERENCE TO RELATED APPLICATIONS

This application claims priority from U.S. Provisional Patent Application No. 61/476,391 filed on 18 Apr. 2011.

BACKGROUND

The invention relates generally to the field of active rectifier circuits, and more specifically to active rectifier circuits used in photovoltaic (PV) solar power systems as bypass rectifiers and blocking rectifiers.

FIG. 1 shows a high level diagram of an example PV solar array consisting of two strings 1 and 2 wired in parallel and feeding their combined currents into a converter 3. Each string consists of a blocking rectifier 4 and a plurality of solar panels 5, and each solar panel has an associated bypass rectifier 6. The purpose of the bypass rectifiers 6 is to protect the solar panels 5 from damage when the PV solar array is partially shaded. For example, in FIG. 1 one panel in the first string 1 is shaded by some obstruction 7 such as a cloud or tree branch, while the other panels all receive full sunlight. The unshaded panels try to force current to flow through the shaded panel, but the bypass rectifier 6 provides an alternate current path around the shaded panel, thus protecting it from damage. But since the first string 1 contains a shaded panel, its output voltage is lower than that of the second string 2 where all the panels are in full sunlight. The blocking rectifiers 4 prevent the string with the lower voltage 1 from draining current produced by the unshaded string 2.

The bypass and blocking rectifiers degrade the efficiency of the PV solar array because they dissipate significant amounts of power. As current flows through a rectifier in the forward direction (from anode to cathode) a voltage drop develops across the rectifier, resulting in heat being produced inside the rectifier. For example, a typical Schottky used as a bypass rectifier would have a forward voltage drop of about 500 mV at 10 A; thus wasting up to 5 W of power. Additionally, Schottky rectifiers have high reverse leakage currents, typically in the range of 10 mA when the junction temperature is 75° C., so energy is wasted in every bypass rectifier, even when none of the solar panels are shaded. A typical blocking rectifier has an even larger forward voltage drop of about 1.2V at 10 A, thus wasting up to 12 W each. What is more, power is wasted continuously in the blocking rectifiers as long as the sun is out, as opposed to the losses in the bypass rectifiers, which can vary as transient shading conditions come and go throughout the day.

The bypass and blocking rectifiers also reduce the systems reliability because of their high junction temperatures. The rectifiers are typically mounted inside enclosures to protect them from moisture and contamination, but these enclosures also have the undesirable effect of acting as thermal insulators that trap the heat. For example, a typical PV solar panel includes three bypass rectifiers inside a plastic enclosure mounted on the back side of the panel. If the entire panel is shaded, then all three bypass rectifiers can dissipate 5 W each, for a total of 15 W dissipation inside the small plastic enclosure. This can easily result in the bypass rectifiers junction temperatures exceeding 200° C., which can severely shorten their lifespans. What is more, Schottky bypass rectifiers are also vulnerable to a destructive phenomenon called thermal runaway because of their high leakage currents, which double for every 10° C. increase in junction temperature. As the leakage current increases, it heats the bypass rectifier further, which produces even more leakage current; this positive feedback loop sometimes leads to a the bypass rectifier failing and becoming a short circuit.

When just one bypass or blocking rectifier fails, it prevents the system from operating all the PV cells at their maximum power point. This can decrease the system efficiency by up to 50%. The large number of bypass and blocking rectifiers in a typical PV solar array makes their reliability all the more critical.

What is needed to increase the efficiency and reliability of PV solar arrays, are better rectifiers with lower forward voltage drop, lower reverse leakage current, and higher reliability. One solution well known to the art is an active rectifier, which consists of a transistor used as a switch, and circuitry for controlling the transistor such that the switch closes to allow current flow in the forward direction; and the switch opens to prevent current flow in the reverse direction. The forward voltage drop in an active rectifier can easily be ten times lower than in a Schottky rectifier at the same current, and twenty times lower than a silicon rectifier. Additionally, the reverse leakage current in an active rectifier is typically thousands of times lower than with a Schottky, thus eliminating the threat of thermal runaway. This not only boosts system efficiency at the beginning of life, but also helps to maintain peak efficiency over time because their dramatically lower junction temperatures make active rectifiers more reliable.

The main challenge faced when designing active rectifier circuits for PV solar arrays, is providing power to run the control circuitry. Most active rectifier circuits are used in the field of power conversion (e.g. switching-mode power supplies) where there is usually a supply voltage available to power the active rectifier control circuitry. In contrast, for bypass and blocking rectifiers in PV solar arrays, there is no readily available power source for the control circuitry; therefore, the active rectifier circuit must power itself.

To illustrate the problem of self-powering FIG. 2 shows an example of prior art disclosed in U.S. patent application Ser. No. 11/094,369 (the '369 application). The '369 application describes an active rectifier circuit that does not self-power, comprising: an anode 8; a cathode 9; a power MOSFET 10; an offset bias voltage source 11; and an operational amplifier (opamp) 12. Before the power MOSFET 10 is turned on, current can flow from anode 8 to cathode 9 via the body diode 14 that forms an integral part of the power MOSFET 10. The resulting voltage drop across the body diode 14 is larger than the bias voltage 11, so the differential voltage across the opamp 12 inputs is positive, causing the opamps output to swing high, which turns on the power MOSFET 10. Once the power MOSFET 10 turns on, the anode-to-cathode voltage drops drastically, but then negative feedback maintains the anode-to-cathode voltage at a constant level, equal to the offset bias voltage 11. The negative feedback mechanism operates as follows: the differential input voltage to the opamp 12 is the anode-to-cathode voltage minus the bias voltage 11; if the anode-to-cathode voltage falls below the offset bias voltage, the opamp 12 decreases the voltage applied to the gate of the MOSFET 10; the decreased gate voltage results in increased channel resistance in the MOSFET 10; the increased channel resistance results in increased anode-to-cathode voltage, bringing it back up to the level of the bias voltage 11, and thus closing the negative feedback loop.

While the circuit of FIG. 2 performs the basic functions of an active rectifier, it is not practical for applications such as bypass or blocking rectifiers in PV solar arrays because it is not self-powering and requires an external supply voltage 13 to power the opamp 12. For example, in FIG. 1, the potential between the bypass rectifier 6 at the top of the first string 1 and the bypass rectifier at the bottom of the same string can be hundreds of Volts. So, in order to utilize the circuit of FIG. 2 to replace the bypass rectifiers in FIG. 1, a power supply with many isolated outputs (one output for each active rectifier circuit) would be needed.

FIG. 3 shows another example of prior art disclosed in U.S. patent application Ser. No. 12/815,496 (the '496 application). The '496 application describes a self-powered active rectifier circuit that is in many ways analogous to the circuit from the '369 application: both circuits employ a power MOSFET 10 as the switch to conduct current from anode 8 to cathode 9. A charge pump 19 in FIG. 3 provides a large voltage gain similar to the opamp 12 in FIG. 2. The minimum voltage required to maintain operation of the charge pump 19 in FIG. 3 is roughly analogous to the offset bias voltage 11 in FIG. 2. Thus, both circuits employ similar feedback mechanisms to regulate the voltage from anode to cathode when current is flowing through the circuit in the forward direction. The main difference between the two inventions is that the circuit in FIG. 3 is self-powering because it is able to produce the power MOSFET gate drive voltage by multiplying the anode-to-cathode voltage with a charge pump 19. Therefore, an active rectifier like the one in FIG. 3 can replace the bypass rectifiers 6 in FIG. 1 without the need for any external power supplies.

But there are at least two drawbacks to the circuit in FIG. 3. First, it's poorly suited for use as a blocking rectifier because it's constructed as an Integrated Circuit (IC). A blocking rectifier typically must withstand at least 300V reverse bias, which is extremely difficult and costly to achieve with an IC. Second, the circuit is very complex; in order to get enough voltage gain, the charge pump 19 must have a large number of stages, each with a capacitor 15. What is more, the charge pump 19 requires a clock source 16, and a subcircuit 17 that produces several non-overlapping clock phases. And the charge pump 19 cannot start up on its own; it requires a start-up unit 18 consisting of yet more oscillators and charge pumps. All of this adds significantly to the cost and complexity of the circuit.

Accordingly, there is a continuing need in the field of photovoltaic solar power for an active rectifier circuit that is self-powered, has very low forward voltage drop and reverse leakage current, and is extremely reliable. The present invention fulfills these needs and provides other related advantages.

SUMMARY

The self-powered active rectifier circuit includes an anode terminal; a cathode terminal; a power MOSFET arranged between the anode and cathode; an oscillator subcircuit; a rectifier subcircuit; a bleeder subcircuit; a diode arranged to allow current flow through the oscillator subcircuit when the anode voltage is greater than the cathode voltage; and in some embodiments, a switch arranged in parallel with the diode. The bleeder subcircuit may include a resistor disposed between the gate and source of the power MOSFET. The bleeder subcircuit may also include a bipolar transistor and a base resistor arranged to discharge the power MOSFET gate-to-source capacitance when the cathode voltage is greater than the anode voltage. In some embodiments the rectifier subcircuit simply rectifies the periodic voltage waveform produced by the oscillator subcircuit, while in other embodiments the rectifier subcircuit also multiplies the voltage. In some embodiments the rectifier subcircuit also includes a capacitor to block dc current from the oscillator subcircuit. And, in some embodiments, the oscillator subcircuit is comprised of a transformer with two windings, and a depletion-mode MOSFET.

The method of operation of the self-powered active rectifier circuit includes steps of: utilizing the anode-to-cathode voltage to power an oscillator subcircuit when the anode voltage is greater than the cathode voltage; generating a periodic voltage waveform with amplitude that is typically at least fifty times greater than the voltage that powers the oscillator; converting the periodic voltage waveform to a dc voltage; applying the dc voltage between the gate and source of the power MOSFET; and in some embodiments, increasing the dc voltage via a positive feedback mechanism that closes a switch when the dc voltage exceeds a predetermined threshold, where the switch is arranged to increase the supply voltage to the oscillator, which results in increased dc voltage. In some embodiments, the step of converting the periodic voltage waveform to the dc voltage uses rectification and filtering, while in other embodiments the conversion step also includes voltage multiplication.

BRIEF DESCRIPTION OF THE DRAWINGS

The accompanying drawings illustrate the invention. In such drawings.

DETAILED DESCRIPTION

Figure 6:
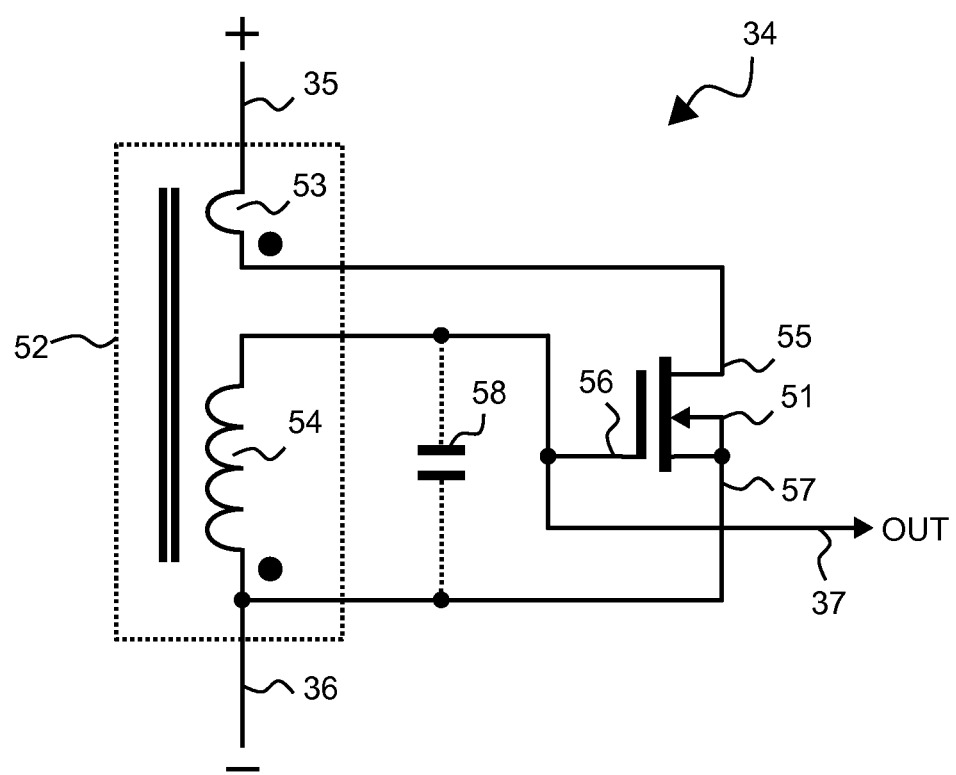
FIG. 6 illustrates a preferred embodiment of the oscillator subcircuit that is part of the self-powered active rectifier circuit.
Figure 7:
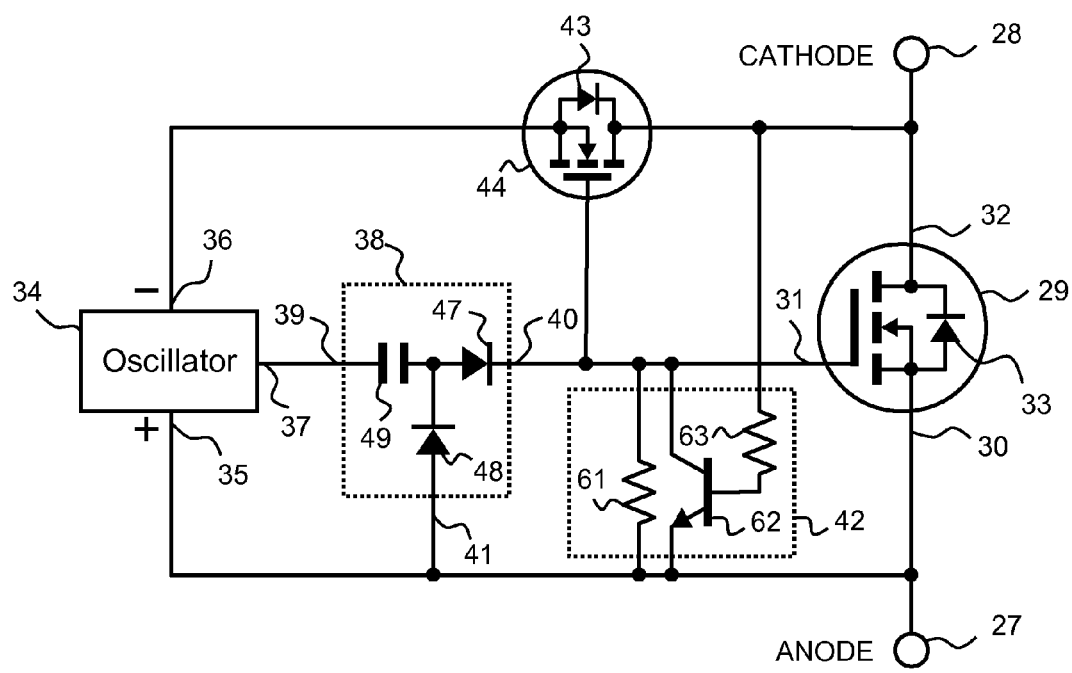
FIG. 7 illustrates a preferred embodiment of the self-powered active rectifier circuit, including details of the preferred embodiments of the switch and bleeder subcircuit.
Figure 8:
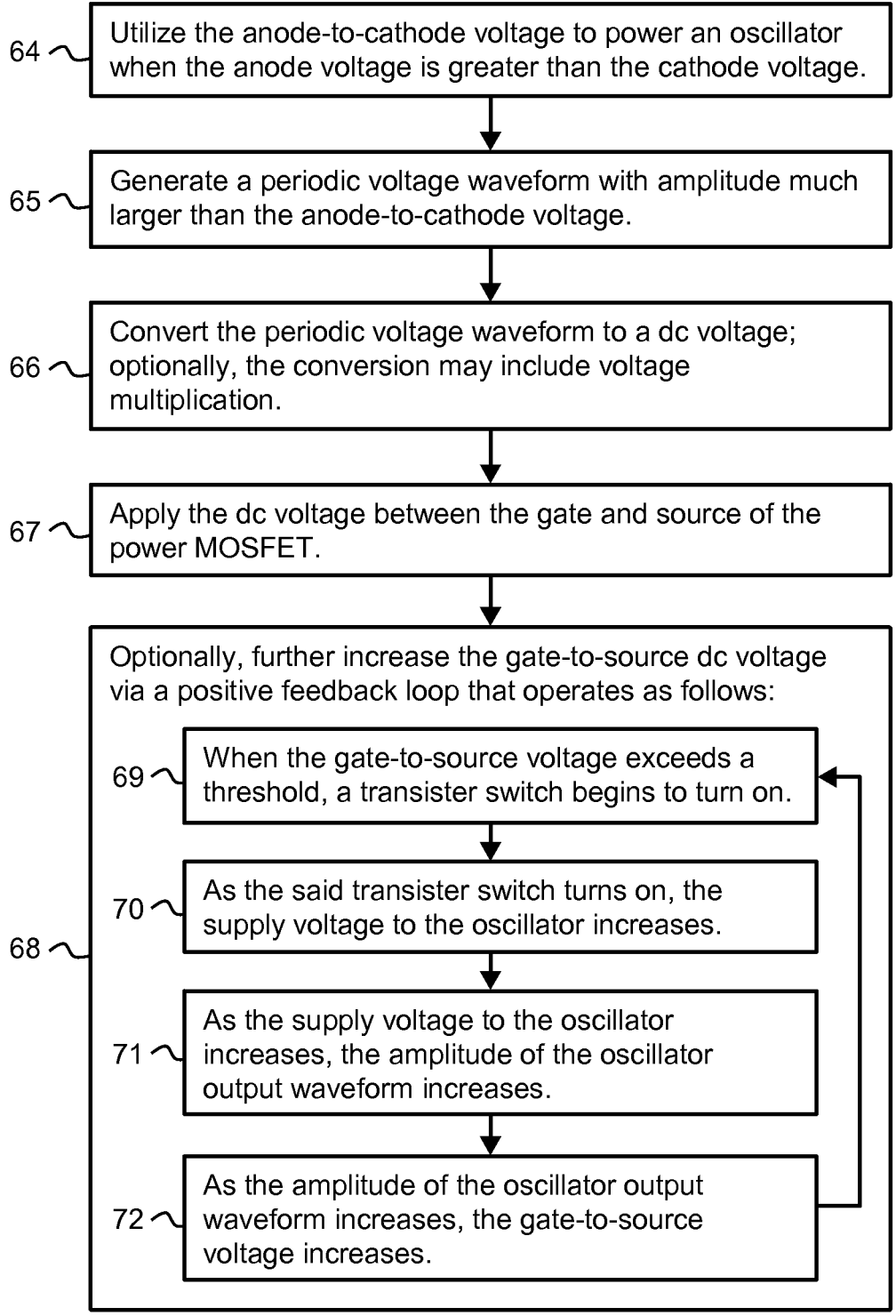
FIG. 8 illustrates a high level flow chart diagram that describes a preferred embodiment of the method of operation of the self-powered active rectifier circuit.

As shown in the drawings for purposes of illustration, the present invention for a self-powered active rectifier circuit is shown with respect to FIGS. 4-7 and the related method of operation is shown generally with respect to FIG. 8. The active rectifier circuit is suitable to directly replace the bypass 6 and blocking 4 rectifiers in a PV solar array, such as the one in FIG. 1 with the affect of improving the efficiency and reliability of the array.

Figure 4:
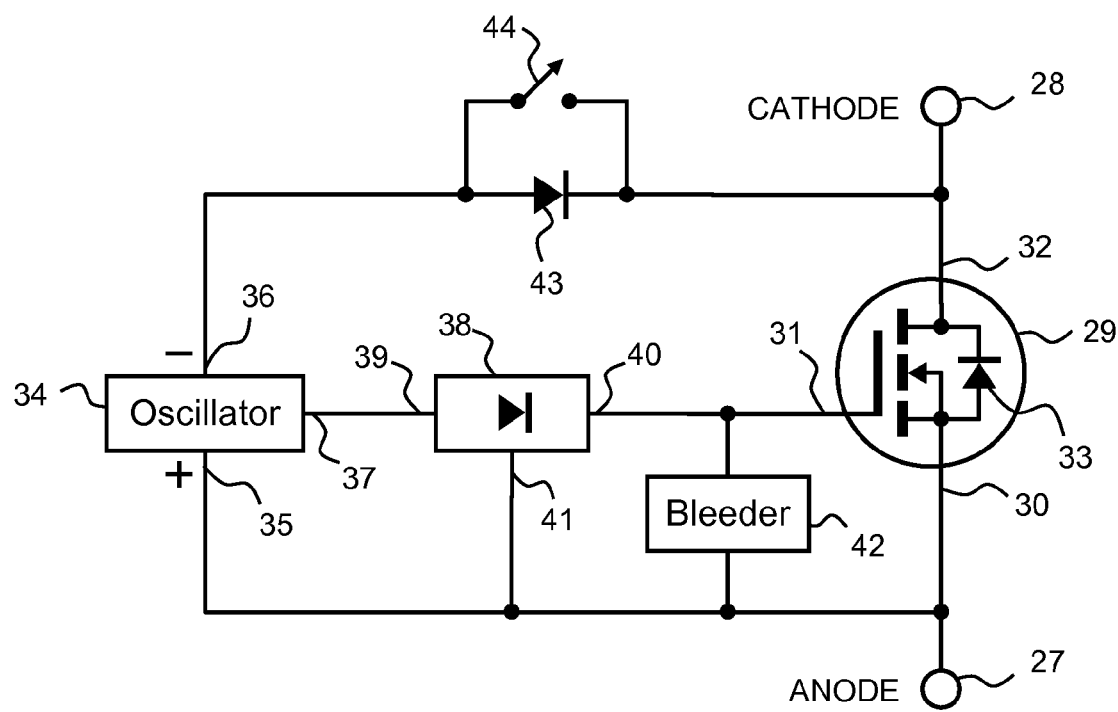
FIG. 4 illustrates a high level block diagram of a self-powered active rectifier circuit disclosed herein.

FIG. 4 shows a high level block diagram of a self-powered active rectifier circuit having an anode terminal 27; a cathode terminal 28; a power MOSFET 29 with a source 30, a gate 31, a drain 32, and an integral body diode 33 arranged to conduct current from the anode terminal 27 to the cathode terminal 28;

an oscillator subcircuit 34 which is powered by a voltage potential between its positive power input 35 and its negative power input 36 and produces a large periodic voltage waveform at its output 37; a rectifier subcircuit 38 with an input 39 coupled to the output 37 of the oscillator, an output 40 connected to the gate 31 of the power MOSFET 29, and a common terminal 41 connected to the source 30 of the power MOSFET 29; a bleeder subcircuit 42 disposed between the gate 31 and source 30 of the power MOSFET 29; a diode 43 arranged to allow current through the oscillator subcircuit power supply inputs 35 and 36 when the anode voltage is greater than the cathode voltage; and in some embodiments, a switch 44 arranged in parallel with the diode 43.

Figure 5A:
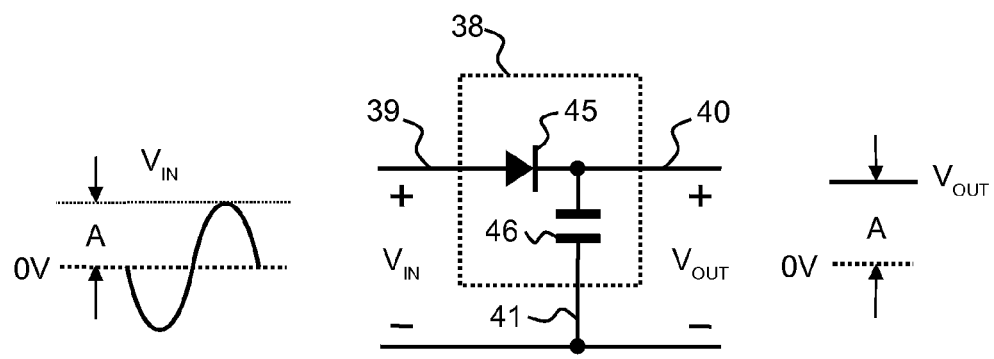
FIG. 5A illustrates one embodiment of the rectifier subcircuit wherein the periodic input voltage is simply rectified and filtered.
Figure 5B:
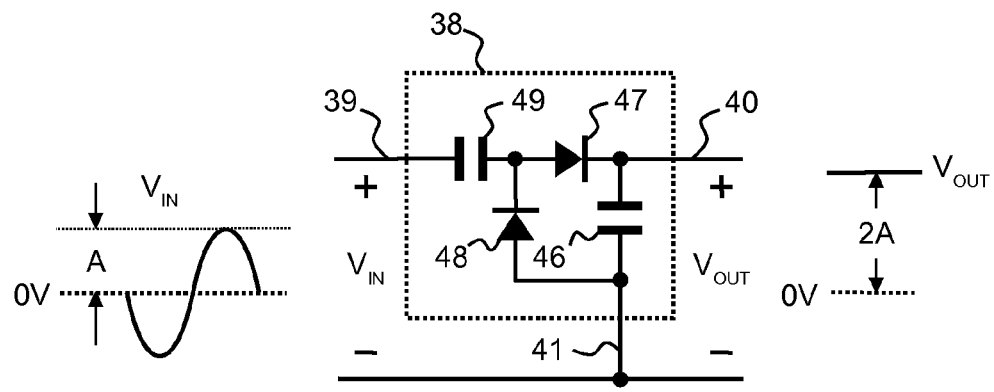
FIG. 5B illustrates a second embodiment of the rectifier subcircuit wherein voltage multiplication is utilized.

The rectifier subcircuit 38 rectifies the periodic voltage waveform produced by the oscillator 34, and in some embodiments also multiplies the resulting dc voltage. FIG. 5A shows a first exemplary embodiment of the rectifier subcircuit 38 comprised of a rectifier 45 and an output capacitor 46. In this first example embodiment the dc voltage at the output 40 is simply equal to the amplitude of the ac voltage applied to the input 39. FIG. 5B shows a second exemplary embodiment of the rectifier subcircuit 38 which is a classic voltage doubler comprised of two rectifiers 47 and 48, an input capacitor 49, and an output capacitor 46. In this second example embodiment, the dc voltage at the output 40 is approximately equal to twice the amplitude of the ac voltage applied to the input 39. Many other embodiments are possible that employ a plurality of capacitors and diodes arranged into well known voltage multiplier circuit topologies.

In some embodiments the rectifier subcircuit 38 output capacitor 46 can be omitted because the input capacitance of the power MOSFET 29, to which the output 40 of rectifier subcircuit is connected, can serve the same function of smoothing the dc voltage output from the rectifier subcircuit.

FIG. 6 shows a preferred embodiment of the oscillator subcircuit 34. In this example, the oscillator subcircuit 34 is comprised of: a depletion-mode MOSFET 51; and a transformer 52 with a primary winding 53, and secondary winding 54. The primary winding 53 is disposed between the positive power supply input 35 and the drain 55 of the depletion-mode MOSFET 51. The secondary winding 54 is disposed between the gate 56 and the source 57 of the depletion-mode MOSFET 51 and the source 57 is also connected to the negative power supply input 36. The two transformer windings 53, 54 are arranged to provide voltage feedback from the drain 55 to the gate 56 with phase angle and gain sufficient to assure that the subcircuit oscillates. In some embodiments a capacitor 58 is added in parallel with the secondary winding 54 of the transformer 52 to tune the oscillator subcircuit 34 to a particular frequency.

The oscillator subcircuit 34 of FIG. 6 has two characteristics that are critical to the operation of the self-powered active rectifier circuit: the ability to operate at extremely low supply voltage; and the ability to produce an output waveform with amplitude many times greater than the supply voltage. The low voltage operation is achieved by the use of the depletion-mode MOSFET 51 which has low resistance between its drain 55 and source 57 while the voltage from its gate 56 to its source 57 is zero. Thus, current flows through the depletion-mode MOSFET 51 and the primary winding 53 of the transformer 52, even at start-up when the gate-to-source voltage is initially zero. The high output amplitude is achieved because the insulated gate 56 of the depletion-mode MOSFET 51 does not clip or clamp the output voltage, and because the transformer 52 turns ratio (the number of turns in the secondary winding 54, divided by the number of turns in the primary winding 53) is very large, for example 100:1 or greater. Thus, a small voltage swing on the drain 55 produces a large voltage swing at the gate 56.

FIG. 7 discloses more details of a preferred embodiment of the self-powered active rectifier circuit where the switch 44 is a MOSFET and the diode 43 is implemented by the body diode 43 which is an integral part of the MOSFET 44.

FIG. 7 also discloses the bleeder subcircuit 42 including a passive bleeder in the form of a resistor 61; and optionally, an active bleeder comprised of a bipolar transistor 62 and a base resistor 63. When the forward current through the self-powered active rectifier circuit drops toward zero, the anode-to-cathode voltage also approaches zero; at some threshold, typically in the range of 30 mV to 60 mV, the anode-to-cathode voltage becomes too small to sustain the operation of the oscillator subcircuit 34. Consequently, the oscillator subcircuit shuts down, and the rectifier subcircuit 38 can no longer output current to sustain the voltage across the passive bleeder 61. Thus, the gate-to-source capacitance discharges, the gate-to-source voltage drops, and the power MOSFET 29 soon begins to turn off. However, as the power MOSFET 29 starts to turn off, the drain-to-source voltage can increase rapidly (because a positive voltage may be applied from cathode to anode by an external source) resulting in charge flowing into the gate 31 via the drain-to-gate capacitance of the power MOSFET 29; this charge flow partially cancels the current in the passive bleeder 61 and thus slows the turn-off process. The optional active bleeder (62 and 63) speeds up the turn-off process. As the drain 32 voltage increases with respect to the source 30, current flows through the base resistor 63 into the base of the bipolar transistor 62. Consequently, the bipolar transistor 62 turns on, and rapidly pulls down the gate 31 of the power MOSFET 29.

FIG. 8 illustrates a method of operation of the self-powered active rectifier circuit. The method of operation is comprised of several steps. In the first step 64, the anode-to-cathode voltage is utilized to power the oscillator subcircuit 34. When the voltage at the anode 27 is greater than the voltage at the cathode 28, the diode 43 allows current to flow through the oscillator subcircuit 34. In the second step 65, the oscillator generates a periodic voltage waveform at its output 37 and the amplitude of the periodic voltage waveform builds up to a level typically fifty to one hundred times greater than the anode-to-cathode voltage that powers the oscillator. In the third step 66, the periodic voltage waveform is converted to a dc voltage by the rectifier subcircuit 38; optionally, this third step may include voltage multiplication as well as rectification. In the fourth step 67, the dc voltage produced by the rectifier subcircuit is applied between the gate 31 and the source 30 of the power MOSFET 29. Some embodiments, the method of operation also includes the optional fifth step 68, where positive feedback mechanism is utilized to further increase the power MOSFET gate-to-source voltage.

The positive feedback mechanism operation is described by steps 69, 70, 71, and 72. In the first step 69 of the positive feedback mechanism, when the output voltage from the rectifier subcircuit 38 exceeds a threshold that is less than or equal to the gate-turn-on threshold of the power MOSFET 29, the transistor switch 44 begins to turn on. As a result of the transistor switch 44 starting to conduct, the voltage drop across the diode 43 is reduced. Therefore, as shown in the second step 70 of the positive feedback mechanism, the supply voltage applied to the oscillator subcircuit 34 is increased. Consequently, the amplitude of the periodic voltage waveform produced by the oscillator subcircuit increases as stated in the third step 71 of the positive feedback mechanism. Thus, the voltage output by the rectifier subcircuit 38 also increases as stated in the fourth step 72 of the positive feedback mechanism. The increased output voltage from the rectifier subcircuit then turns on the transistor switch 44 more fully, thus closing the positive feedback loop.

Figure 1:
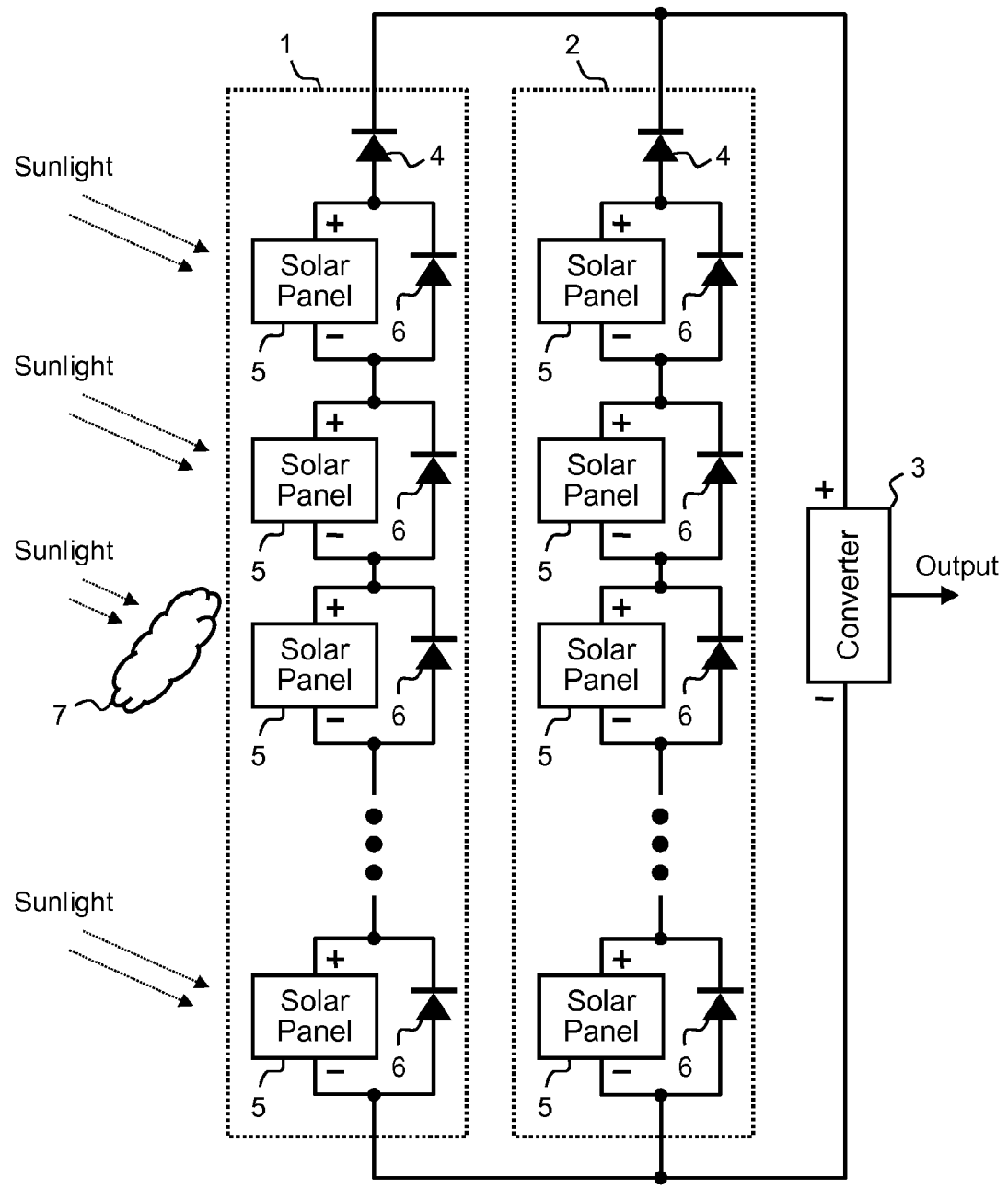
FIG. 1 is an example of a typical photovoltaic solar array to illustrate the need for the self-powered active rectifier circuit disclosed herein.
Figure 2:
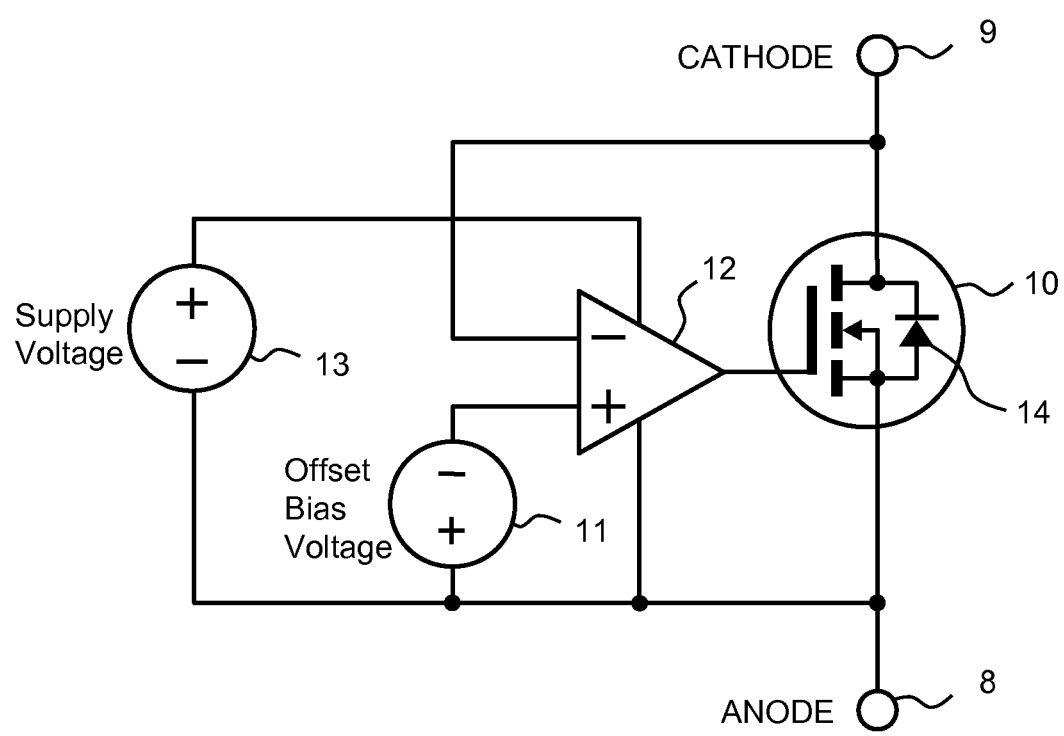
FIG. 2 is a prior art active rectifier circuit that is not self-powering.
Figure 3:
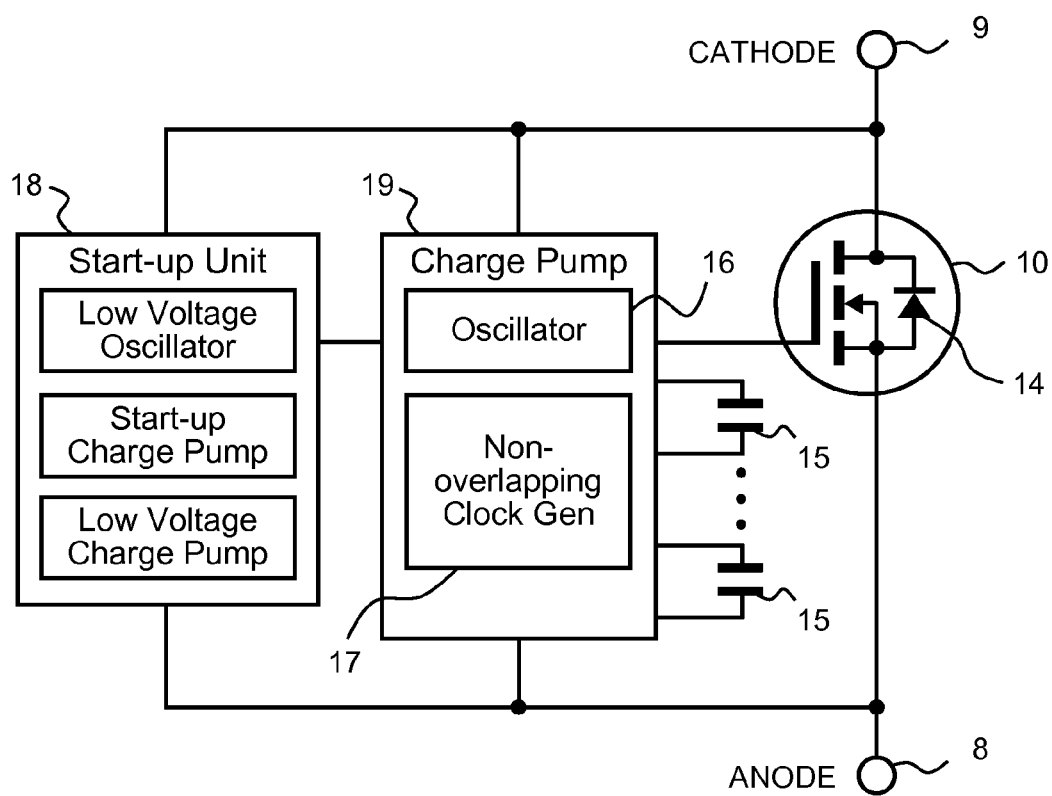
FIG. 3 is a prior art self-powered active rectifier circuit that includes a complex arrangement of several oscillators and charge pumps.

The self-powered active rectifier circuit disclosed herein can improve the efficiency and reliability of PV solar arrays like the one shown in FIG. 1 by directly replacing each of the bypass 6 and blocking 4 rectifiers. For example, when the current in the first string 1 is 10 A, the power dissipation in the associated blocking rectifier 4 can be up to 12 W; however, when the conventional blocking rectifier 4 is replaced by the self-powered active rectifier circuit disclosed herein, the power dissipation drops to about 1 W, for an energy savings of 92%. Similar energy savings are attained when replacing each of the bypass rectifiers 6 with the self-powered active rectifier circuit; while a solar panel 5 is shaded, the power dissipation in the associated bypass rectifier 6 would be up to 5 W if a Schottky is used, but only about 0.5 W with the self-powered active rectifier circuit, for an energy savings of 90%. The greatly reduced power dissipation also provides the benefit of greatly reduced junction temperatures, which translates to improved reliability.

Another advantage of the self-powered active rectifier circuit disclosed herein, is that it is simple enough to be economically and reliably manufactured from discrete components. In contrast, prior art such as disclosed in the '496 application is so complex that it can only be produced in the form of an integrated circuit or multi-chip module. Using discrete components is an advantage because it allows the circuit to be easily adapted to the specific application. For example, when the self-powered active rectifier circuit is used as a bypass rectifier, the power MOSFET 29 requires a drain-to-source breakdown voltage rating of only about 30V. At such low voltage, there are many low-cost power MOSFETs available with very low on-resistance. However, when the self-powered active rectifier circuit is used as a blocking diode, a power MOSFET 29 with a much higher breakdown voltage, 300V for example, would be chosen.

Yet another advantageous aspect of the preferred embodiment of the self-powered active rectifier circuit shown in FIG. 7 is that it prevents the power MOSFET 29 from turning on inadvertently due to leakage currents when the cathode voltage is greater than the anode voltage. All semiconductors have some finite leakage current which increases with temperature. The diode 43 and the switch 44 will leak some small current into the oscillator subcircuit negative supply input 36. In some embodiments of the oscillator (such as the one shown in FIG. 6) the leakage current will be conducted through the oscillator to its output 37, and thence to the input 39 of the rectifier subcircuit 38. The capacitor 49 in the rectifier subcircuit 38 blocks this leakage current from reaching the gate 31 of the power MOSFET 29. Additionally, in some extreme cases (such as a nearby lightning strike) it may be possible for the power MOSFET 29 to be slightly damaged, resulting in a small leakage current from its drain 32 to its gate 31. The active bleeder (62 and 63) provides a discharge path for this leakage current, thus preventing the power MOSFET 29 from turning on.

Although several embodiments have been described in detail for purposes of illustration, various modifications may be made to each without departing from the scope and spirit of the invention. Accordingly, the invention is not to be limited, except as by the appended claims.

What is claimed is:

1. A self-powered active rectifier circuit, comprising:
   an anode terminal;
   a cathode terminal;
   a power MOSFET comprising a source terminal, a drain terminal, a gate terminal, and an integral body diode; the power MOSFET arranged to conduct current from the anode terminal to the cathode terminal via the integral body diode;
   an oscillator subcircuit comprising a positive power supply input, a negative power supply input, and an output; the oscillator subcircuit being operable to produce a periodic voltage waveform with an amplitude relatively greater than a dc voltage potential between the oscillator subcircuit positive power supply input and the oscillator subcircuit negative power supply input;
   a rectifier subcircuit comprising an input, an output, and a common terminal that serves as the reference for both the rectifier subcircuit input and the rectifier subcircuit output; the rectifier subcircuit input is coupled to the oscillator subcircuit output; the rectifier subcircuit output is connected to the power MOSFET gate terminal; the rectifier subcircuit common terminal is connected to the power MOSFET source terminal; the rectifier circuit being operable to convert a periodic voltage waveform at the rectifier circuit input to a dc voltage between the rectifier circuit output and the rectifier circuit common terminal;
   a bleeder subcircuit disposed between the power MOSFET gate and the power MOSFET source; the bleeder subcircuit being operable to discharge the gate-to-source capacitance of the power MOSFET; and
   a diode arranged to allow current flow through the oscillator subcircuit power supply inputs when the voltage potential at the anode terminal is greater than the voltage potential at the cathode terminal.

2. The self-powered active rectifier circuit of claim 1, including a switch arranged in parallel with the diode, the switch being operable to close when the gate-to-source voltage applied to the power MOSFET exceeds a predetermined threshold; the predetermined threshold being less than or equal to the gate-turn-on threshold of the power MOSFET.

3. The self-powered active rectifier circuit of claim 1, wherein the bleeder subcircuit comprises a resistor disposed between the power MOSFET gate and the power MOSFET source.

4. The self-powered active rectifier circuit of claim 1, wherein the bleeder subcircuit comprises an NPN bipolar transistor and a base resistor; the NPN bipolar transistor having a collector, an emitter, and a base; the NPN bipolar transistor collector is connected to the power MOSFET gate; the NPN bipolar transistor emitter is connected to the power MOSFET source; and the base resistor is disposed between the NPN bipolar transistor base and the power MOSFET drain.

5. The self-powered active rectifier circuit of claim 1, wherein the rectifier subcircuit comprises a voltage multiplier.

6. The self-powered active rectifier circuit of claim 1, wherein the rectifier subcircuit comprises at least one capacitor disposed to block dc current flow into the rectifier subcircuit input.

7. The self-powered active rectifier circuit of claim 1, wherein the oscillator subcircuit comprises a transformer and a depletion-mode MOSFET; the depletion-mode MOSFET having a drain, a gate, and a source; the transformer comprises a primary winding disposed between the oscillator subcircuit positive power supply input and the drain of the depletion-mode MOSFET; a transformer secondary winding is disposed between the source and gate of the depletion-mode MOSFET; the depletion-mode MOSFET source is connected to the oscillator subcircuit negative power supply input; and the depletion-mode MOSFET gate is coupled to the oscillator subcircuit output.

8. A method of operation of a self-powered active rectifier circuit, wherein a power MOSFET is arranged between an anode and a cathode of the self-powered active rectifier circuit, and a voltage drop between the anode and cathode is produced by current flowing through the self-powered active rectifier circuit, the method of operation comprising the steps of:
  utilizing the voltage drop from the anode to the cathode of the self-powered active rectifier circuit as a supply voltage to power an oscillator subcircuit when the anode voltage is greater than the cathode voltage;
  generating a periodic voltage waveform with an amplitude greater than the supply voltage that powers the oscillator subcircuit that generates the waveform;
  converting the periodic voltage waveform to produce a dc voltage; and
  applying the dc voltage between the gate and source of the power MOSFET.

9. The method of operation of claim 8, wherein the converting step includes voltage multiplication.

10. The method of operation of claim 8, further comprising the step of utilizing a positive feedback mechanism to increase the dc voltage applied between the gate and source of the power MOSFET.

11. The method of operation of claim 10, wherein the positive feedback mechanism includes the steps of:
  applying the dc voltage between the gate and the source of the power MOSFET to turn on a transistor switch;
  increasing the supply voltage to the oscillator subcircuit as the transistor switch turns on;
  increasing the amplitude of the periodic voltage waveform produced by the oscillator subcircuit in response to the increased supply voltage; and
  increasing the dc voltage applied between the gate and the source of the power MOSFET to complete the positive feedback loop as the amplitude of the periodic voltage waveform increases.

* * * * *